(12) United States Patent
Nemirovsky

(10) Patent No.: US 10,444,078 B2
(45) Date of Patent: Oct. 15, 2019

(54) SENSING DEVICE HAVING A BICMOS TRANSISTOR AND A METHOD FOR SENSING ELECTROMAGNETIC RADIATION

(71) Applicant: TECHNION RESEARCH AND DEVELOPMENT FOUNDATION LTD., Haifa (IL)

(72) Inventor: Yael Nemirovsky, Haifa (IL)

(73) Assignee: TECHNION RESEARCH AND DEVELOPMENT FOUNDATION LTD., Haifa (IL)

( * ) Notice: Subject to any disclaimer, the term of this patent is extended or adjusted under 35 U.S.C. 154(b) by 103 days.

(21) Appl. No.: 15/118,895

(22) PCT Filed: Feb. 12, 2015

(86) PCT No.: PCT/IL2015/050161
§ 371 (c)(1),
(2) Date: Aug. 15, 2016

(87) PCT Pub. No.: WO2015/121861
PCT Pub. Date: Aug. 20, 2015

(65) Prior Publication Data
US 2017/0211983 A1 Jul. 27, 2017

Related U.S. Application Data

(60) Provisional application No. 61/940,385, filed on Feb. 15, 2014.

(51) Int. Cl.
*G01J 5/24* (2006.01)
*G01J 5/20* (2006.01)
(Continued)

(52) U.S. Cl.
CPC .............. *G01J 5/24* (2013.01); *G01J 5/0215* (2013.01); *G01J 5/20* (2013.01);
(Continued)

(58) Field of Classification Search
CPC ...... G01J 5/24; G01J 5/0215; H01L 27/14681; H01L 31/028; H01L 31/1105
See application file for complete search history.

(56) References Cited

U.S. PATENT DOCUMENTS 7,074,623 B2 * 7/2006 Lochtefeld ........ H01L 21/76254
257/E21.415
2009/0289279 A1 * 11/2009 Khare ................ H01L 21/8249
257/190

(Continued)

OTHER PUBLICATIONS

International search report dated Jun. 4, 2015 of PCT/IL2015/050161.

*Primary Examiner* — David P Porta
*Assistant Examiner* — Faye Boosalis
(74) *Attorney, Agent, or Firm* — Reches Patents

(57) ABSTRACT

A method and a sensing device are provided. The sensing device may include a readout circuit, a bulk, a holding element and a heterojunction bipolar transistor; wherein heterojunction bipolar transistor is configured to generate detection signals responsive to a temperature of at least a portion of the heterojunction bipolar transistor; wherein the holding element is configured to support the heterojunction bipolar transistor; wherein the heterojunction bipolar transistor is thermally isolated from the bulk; wherein the readout circuit is electrically coupled to the heterojunction bipolar transistor; and wherein the readout circuit is configured to receive the detection signals and to process the detection signals to provide information about electromagnetic radiation that affected the temperature of the at least portion of the heterojunction bipolar transistor.

36 Claims, 10 Drawing Sheets

(51) Int. Cl.
*H01L 27/146* (2006.01)
*G01J 5/02* (2006.01)
*H01L 31/028* (2006.01)
*H01L 31/11* (2006.01)

(52) U.S. Cl.
CPC ...... *H01L 27/14681* (2013.01); *H01L 31/028* (2013.01); *H01L 31/1105* (2013.01)

(56) References Cited

U.S. PATENT DOCUMENTS

2011/0089516 A1* 4/2011 Sekiguchi ........... H01L 27/0727
 257/443
2013/0206990 A1* 8/2013 Hsu ........................ G01J 5/046
 250/338.4

\* cited by examiner

Manufacturing a multi-layered object that comprises upper layers, an intermediate layer and a lower layer. The upper layers may include a heterojunction bipolar transistor, a holding element and a supporting element. The lower layer may include a bulk. The intermediate layer is positioned between the upper layers and the lower layer. 510

Etching at least a portion of the intermediate layer thereby introducing a gap below the heterojunction bipolar transistor and causing the heterojunction bipolar transistor to be connected only to the holding element and to be thermally isolated from the bulk. 520

SENSING DEVICE HAVING A BICMOS TRANSISTOR AND A METHOD FOR SENSING ELECTROMAGNETIC RADIATION

RELATED APPLICATIONS

This application claims priority from U.S. provisional patent Ser. No. 61/940,385 filing date Feb. 15, 2014 which is incorporated herein by reference.

BACKGROUND OF THE INVENTION

Complementary metal oxide semiconductor (CMOS) sensors may suffer from what is known as 1/f noise. The f stands for frequency and the 1/f noise is especially high in low frequencies such as few Hertz or few tens of Hertz—thereby may be within the frequency of information and thus may be hard to reject using only frequency based filtering techniques.

There is a growing need to provide highly sensitive thermal sensors.

SUMMARY OF THE INVENTION

According to an embodiment of the invention there may be provided a sensing device that may include a readout circuit, a bulk, a holding element and a heterojunction bipolar transistor; wherein heterojunction bipolar transistor is configured to generate detection signals responsive to a temperature of at least a portion of the heterojunction bipolar transistor; wherein the holding element is configured to support the heterojunction bipolar transistor; wherein the heterojunction bipolar transistor is thermally isolated from the bulk; wherein the readout circuit is electrically coupled to the heterojunction bipolar transistor; and wherein the readout circuit is configured to receive the detection signals and to process the detection signals to provide information about electromagnetic radiation that affected the temperature of the at least portion of the heterojunction bipolar transistor.

The heterojunction bipolar transistor may include a base and wherein the base may include Silicon Germanium.

The heterojunction bipolar transistor may include a base terminal, an emitter terminal and a collector terminal, and wherein at least two terminals out of the base terminal, the emitter terminal and the collector terminal are positioned at different heights.

The heterojunction bipolar transistor may include a base and wherein the base may include Silicon Germanium.

The heterojunction bipolar transistor may include a base, a base terminal, an emitter terminal, a buried collector region, a buried oxide region; and wherein at least a majority of the base, the base terminal, the emitter terminal, the buried collector region and the buried oxide region are exposed to an environment of the heterojunction bipolar transistor.

The heterojunction bipolar transistor may be suspended.

The heterojunction bipolar transistor may be configured to convert infrared radiation to heat.

The spatial separation between the supporting element and the heterojunction bipolar transistor may be obtained by utilizing a Micro Electro Mechanical System (MEMS) micro-machined process.

The spatial separation between the supporting element and the heterojunction bipolar transistor may be obtained by utilizing a Nano Electro Mechanical System (NEMS) nano-machined process.

The supporting element may be formed on an oxide layer.

The supporting element may be formed on an oxide layer and the readout circuit may be a Complementary Metal Oxide Semiconductor (CMOS) readout circuit.

The supporting element may include an oxide layer.

The supporting element may include a silicon germanium layer.

The pixel may include one or more insulator layers.

The heterojunction bipolar transistors may be manufactured using a bipolar complementary metal oxide semiconductor (BiCMOS) technology.

The sensing device may include multiple pixels.

According to an embodiment of the invention there may be provided a method for sensing electromagnetic radiation, the method may include receiving the electromagnetic radiation by at least a portion of a heterojunction bipolar transistor thereby changing a temperature of the a least portion of the heterojunction bipolar transistor; generating, by the heterojunction bipolar transistor, detection signals responsive to the temperature of at least portion of the heterojunction bipolar transistor; conveying the detection signals to a readout circuit; wherein the heterojunction bipolar transistor is thermally isolated from a bulk; receiving the detection signals by the readout circuit; and processing the detection signals, by the readout circuit, to provide information about the electromagnetic radiation.

According to an embodiment of the invention there may be provided a method for manufacturing a pixel, the method may include manufacturing a multi-layered object that may include upper layers, an intermediate layer and a lower layer; wherein the upper layers may include a heterojunction bipolar transistor, a holding element and a supporting element; wherein the lower layer may include a bulk; wherein the intermediate layer may be positioned between the upper layers and the lower layer; and etching at least a portion of the intermediate layer thereby introducing a gap below the heterojunction bipolar transistor and causing the heterojunction bipolar transistor to be connected only to the holding element and to be thermally isolated from the bulk; wherein the heterojunction bipolar transistor may be configured to generate detection signals responsive to a temperature of at least a portion of the heterojunction bipolar transistor; and wherein the pixel may include an electrical conductor for conveying the detection signals from the heterojunction bipolar transistor.

The manufacturing a multi-layered object may include applying a bipolar complementary metal oxide semiconductor technology.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 8 illustrates a method according to an embodiment of the invention;

Figure 1:
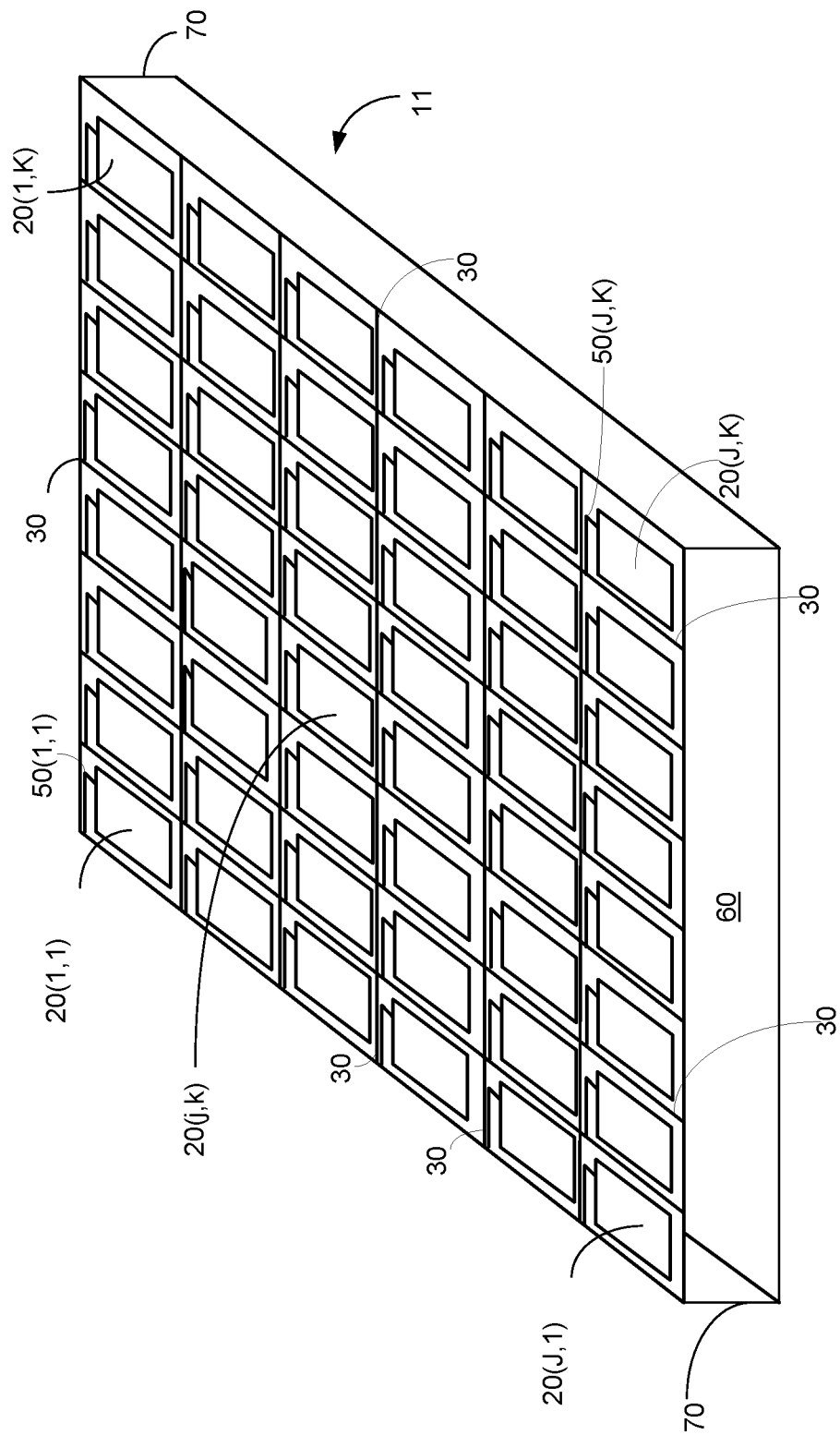
FIG. 1 illustrates a portion of a sensing device according to an embodiment of the invention.

It will be appreciated that for simplicity and clarity of illustration, elements shown in the Figures have not necessarily been drawn to scale. For example, the dimensions of some of the elements may be exaggerated relative to other elements for clarity. Further, where considered appropriate, reference numerals may be repeated among the Figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

According to various embodiments of the invention there is provided a sensing device that may include one or more pixels.

The sensing device can include a readout circuit, and the like. The sensing device can be a camera, can include a camera, and the like.

The term "heterojunction bipolar transistor" is a transistor that includes a base region, an emitter region and a collector region, wherein the emitter and the base regions include different semiconductor materials thereby creating a heterojunction.

The term "bipolar complementary metal oxide semiconductor" (BiCMOS) is a technology that integrates CMOS and bipolar technologies in a single integrated circuit.

A BiCMOS transistor is a transistor that is manufactured using BiCMOS technology.

The heterojunction bipolar transistor may be manufactured using BiCMOS technology or may be manufactured using another type of technology. In some of the following examples the heterojunction bipolar transistor is referred to as a BiCMOS transistor—but any reference to a BiCMOS transistor is only a non-limiting example of a heterojunction bipolar transistor.

According to an embodiment of the invention the heterojunction bipolar transistor may be manufactured using nanometric BiCMOS-SOI technology and released by post processing dry etching. The heterojunction bipolar transistors may have a base that includes Silicon Germanium (SiGe), may have one or more isolating layers and may be vertical in the sense that not all of its nodes (base, collector and emitter nodes) are at the same height.

The heterojunction bipolar transistor is thermally isolated (for example—suspended), is immune to $1/f$ noise and may be a building block of a thermal sensor.

FIG. 1 illustrates a portion 11 of a sensing device 10 according to an embodiment of the invention.

Figure 9:
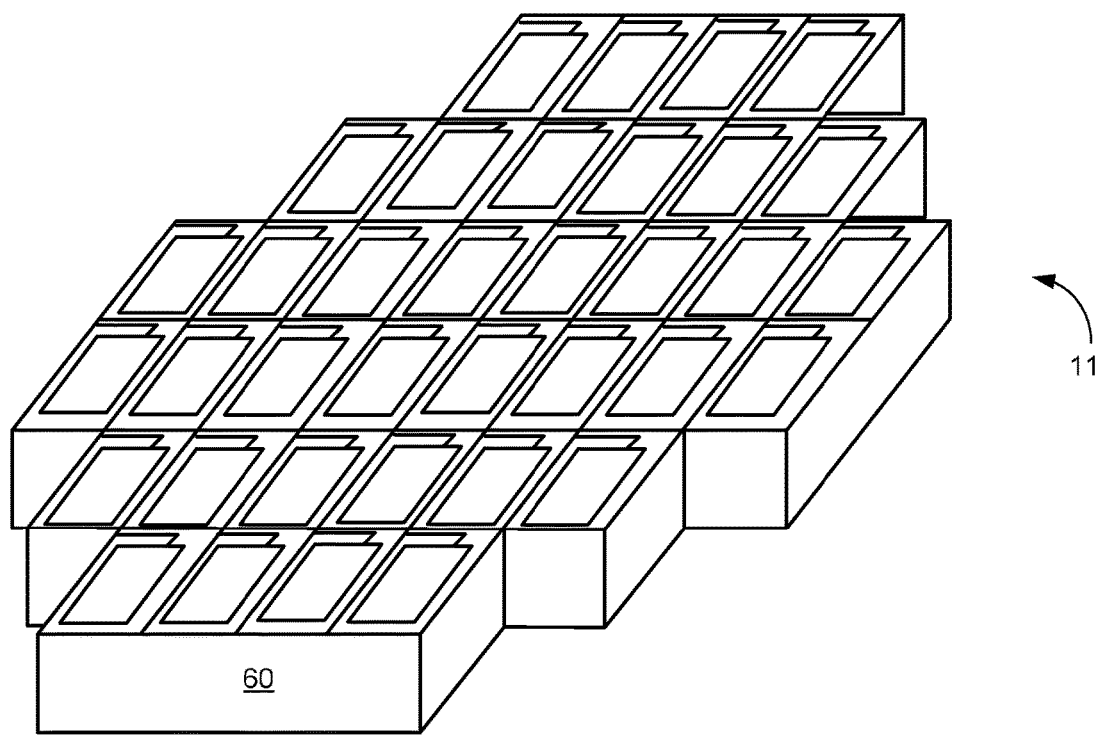
FIG. 9 illustrates a non-rectangular array of pixels according to an embodiment of the invention.

FIG. 1 illustrates an array of pixels that are configured in a rectangular matrix and includes heterojunction bipolar transistors 20(1,1)-20(J,K). Wherein index J is a number of rows in the array and K is a number of columns of the array. K and J are positive integers. It is noted that any other arrangement of pixels may be provided. For example—the pixels may be configured in a linear array, may be configured in an array that is not rectangular (for example—the array may be a circular array, a polygon shaped array that has more than four facets), and the pixels may be configured in a non-ordered array. FIG. 9 illustrates a non-rectangular array of pixels according to an embodiment of the invention.

Each heterojunction bipolar transistor 20(j,k) is suspended. Index j ranges between 1 and J and index k ranges between 1 and K. The suspension may include having each heterojunction bipolar transistor connected to, via a holding element to the bulk or to support elements that support the holding element and/or the heterojunction transistor. The support element may be of many forms and shapes and is illustrated as a mesh 30 of frames. In FIG. 1 heterojunction bipolar transistor 20(1,1) is held by holding element 50(1,1) and heterojunction bipolar transistor 20(J,K) is held by holding element 50(J,K). These holding elements may contact the bulk or may be connected to support elements that support these holding elements.

Any other shaped support element may be provided. The support element provides mechanical support to holding elements that contact the heterojunction bipolar transistors while being thermally isolated from the heterojunction bipolar transistor. The holding elements may be of any shape and size.

The heterojunction bipolar transistor 20(j,k) is positioned above (without contacting) a bulk 60, wherein the bulk 60 may be connected to the holding element via supporting elements such as a frame, frame sidewalls and the like. The space between the bulk 60 and the heterojunction bipolar transistors, the holding elements 50 and the supporting element 30 may have been formed using micro-machining and/or etching processes.

Figure 2:
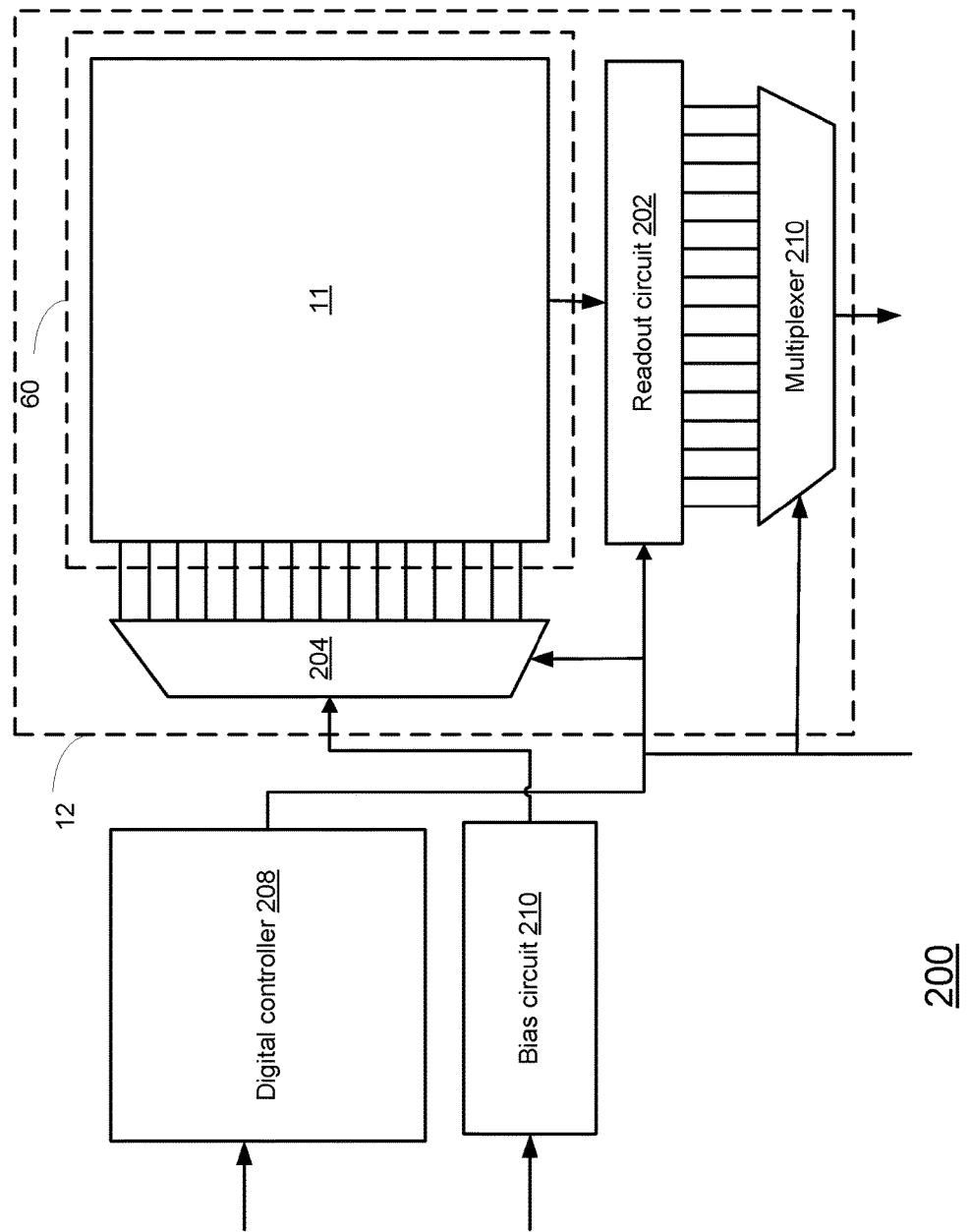
FIG. 2 illustrates a sensing device according to an embodiment of the invention.

FIG. 2 illustrates a sensing device 10 according to an embodiment of the invention.

FIG. 2 illustrates the sensing device 10 as including a die 12 that includes analog components such as portion 11, readout circuit 202, de-multiplexer 204 and multiplexer 210.

Each heterojunction bipolar transistor (denoted 20(1,1)-20(J,K) in FIG. 1) of portion 11 is configured to generate detection signals responsive to a temperature of at least a portion of the heterojunction bipolar transistor. The readout circuit 202 is configured to receive the detection signals of each heterojunction bipolar transistor and to process the detection signals to provide information about electromagnetic radiation that affected the temperature of the at least portion of each of the heterojunction bipolar transistors.

Die 12 includes bulk 60 that may have been etched and/or micro-machined to remove the silicon substrate and form the space below the heterojunction bipolar transistors and the holding elements. The supporting elements may be connected to the bulk on one hand and to the holding elements on the other hand.

The sensing device 10 may also include digital components such as digital controller 208 and bias circuit 210. It is noted that die 12 can include digital components and that one or more dies can include one or more of the components of FIG. 2. The readout circuit and the heterojunction bipolar transistors may be included in a single die or in more than one die.

The digital controller 208 may be configured to control which pixel should be read by controlling the readout circuit 202, which pixel should be provided bias voltages (from bias circuit 210 and via de-multiplexer 204).

The heterojunction bipolar transistors (denoted 20(1,1)-20(J,K) in FIG. 1) of portion 11 may be electrically coupled to the de-multiplexor 204 and to the readout circuit 202 via conductors that are part of (or are connected to) the holding elements (denoted 50 in FIG. 1) and the supporting element (denoted 30 in FIG. 1).

Figure 3:
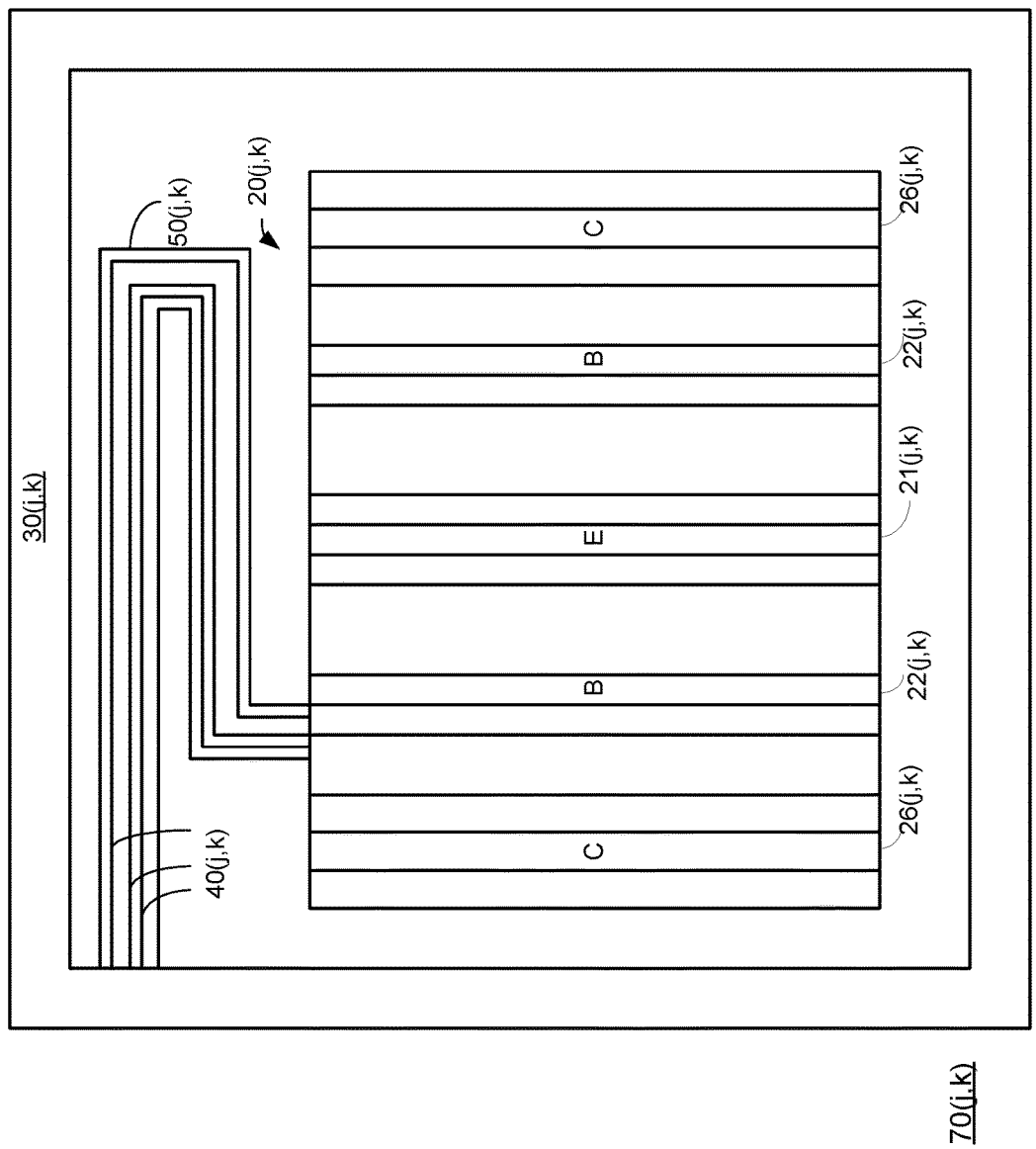
FIG. 3 is a top view of a pixel according to an embodiment of the invention.
Figure 4:
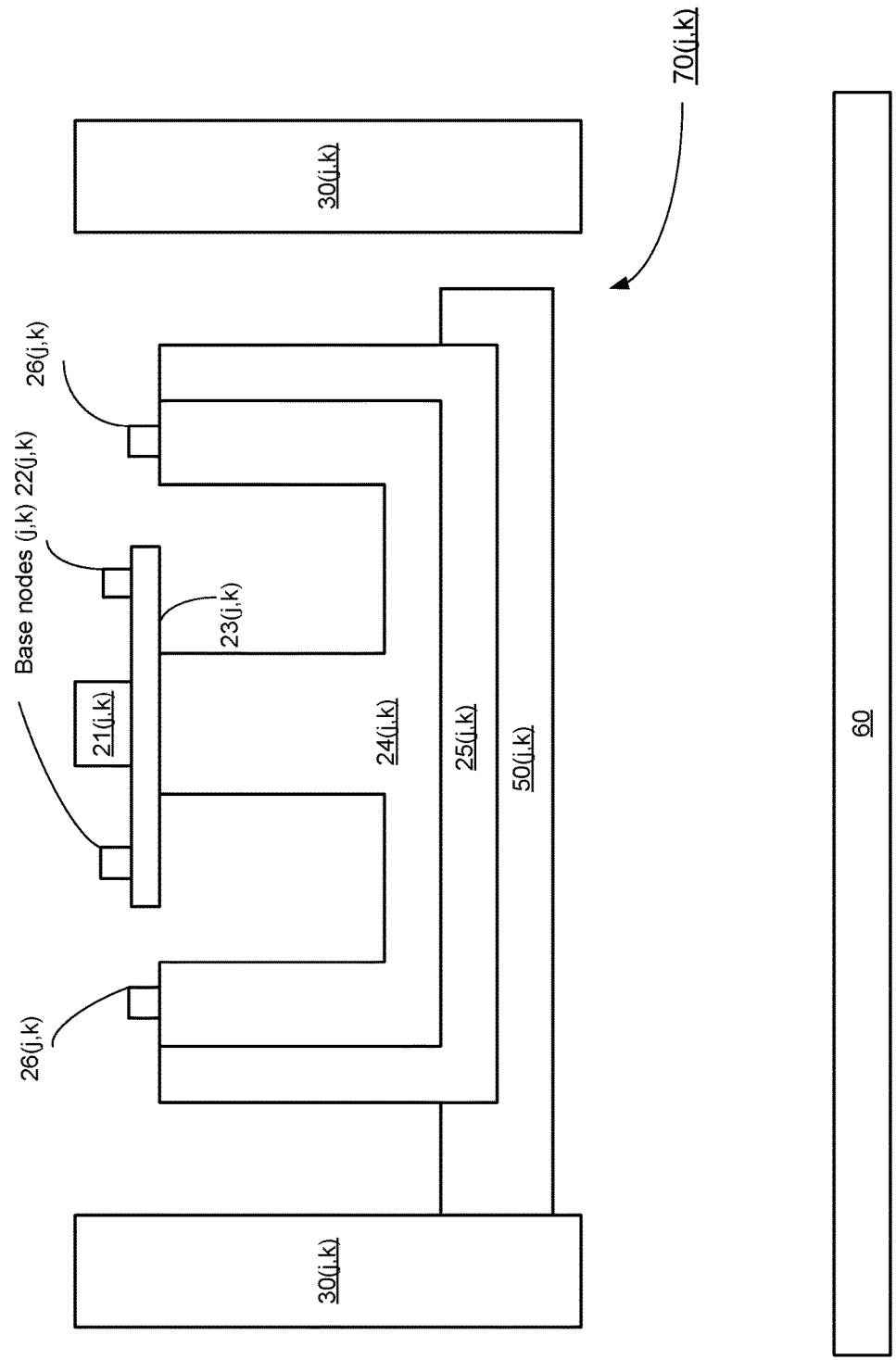
FIG. 4 is a cross sectional view of a pixel according to an embodiment of the invention.
Figure 5:
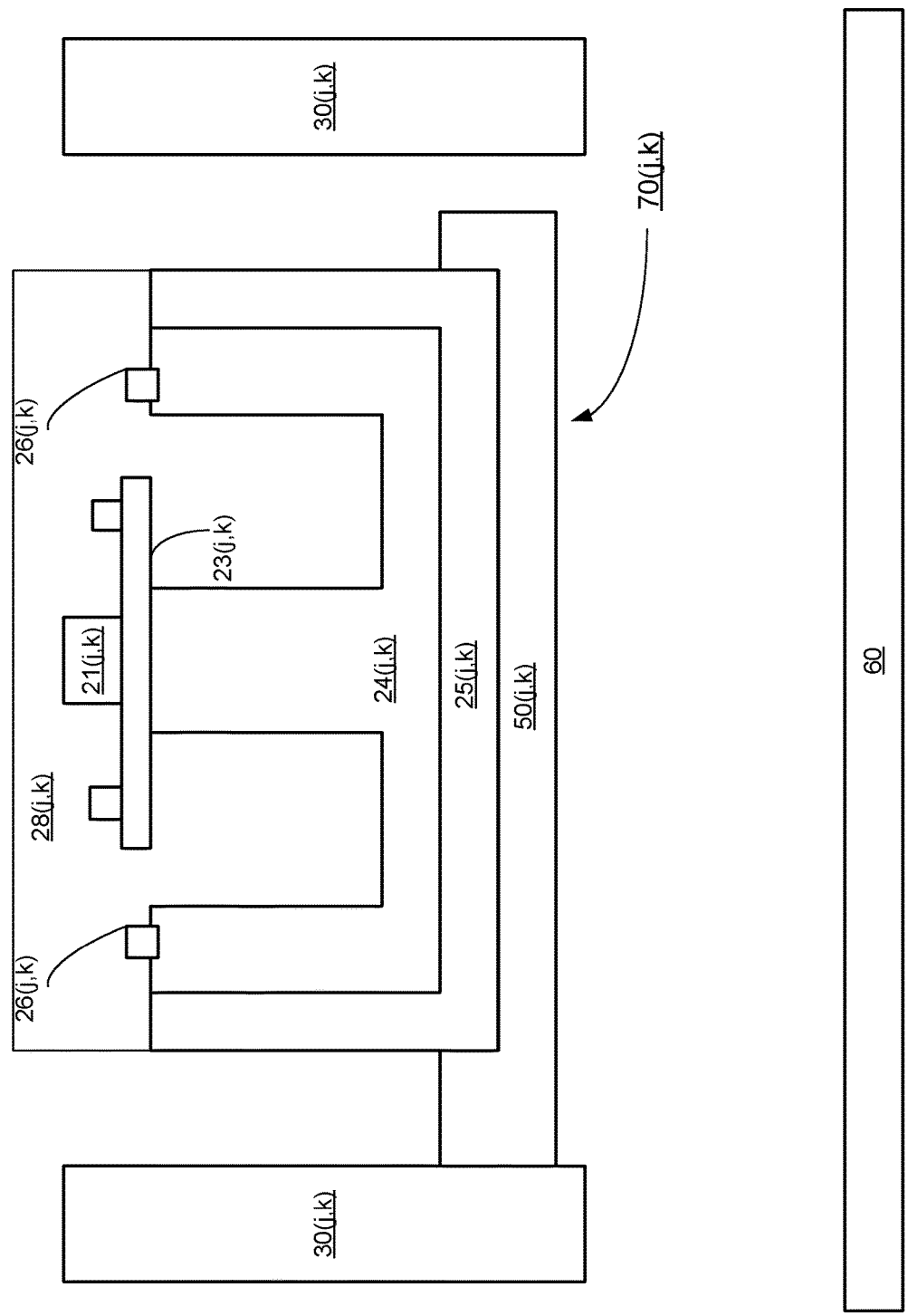
FIG. 5 is a cross sectional view of a pixel according to an embodiment of the invention.

FIG. 3 is a top view of a pixel 70(j,k) according to an embodiment of the invention. FIGS. 4 and 5 are cross sectional views of pixel 70(j,k) according to various embodiments of the invention.

Pixel 70(j,k) includes heterojunction bipolar transistor 20(j,k), a holding element 50(j,k) and a frame 30(j,k) that forms a part of the supporting element 30 of FIG. 1.

The heterojunction bipolar transistor 20(j,k) transistor is configured to generate detection signals responsive to a temperature of at least a portion of the heterojunction bipolar transistor 20(j,k). The holding element 50(j,k) is connected between the heterojunction bipolar transistor 20(j,k) and frame 30(j,k). Holding element 50(j,k) is illustrated as including (or otherwise supporting) conductors 40(j,k). The heterojunction bipolar transistor 20(j,k) may be thermally isolated from the support element 30(j,k).

FIGS. 3-5 illustrate the heterojunction bipolar transistor 20(j,k) as including:
a. A base 23(j,k) that may include Silicon Germanium.
b. Two base nodes 22(j,k) formed on top of base 23(j,k).
c. An emitter node 21(j,k) formed between the two base nodes 22(j,k) and on top of base 23(j,k).
d. Collector nodes 26(j,k).
e. A buried sub-collector 24(j,k) that supports base 23(j,k) and the two collector nodes 26(j,k). Two shallow trenches 27(j,k) are formed in the buried sub-collector 24(j,k).
f. A buried oxide layer 25(j,k) that supports the buried sub-collector 24(j,k).

The emitter node 21(j,k) and the base nodes 22(j,k) are positioned above the collector nodes 26(j,k). The top of emitter node 21(j,k) is higher than the top of the base nodes 23(j,k).

The heterojunction bipolar transistor 20(j,k) of FIG. 5 differs from the heterojunction bipolar transistor 20(j,k) of FIG. 4 by including an additional layer 28(j,k) that covers the base 23(j,k), the base nodes 22(j,k), the emitter node 21, the collector nodes 26(j,k), and the buried sub-collector 24(j,k). In FIG. 4 this additional layer has been removed thus further exposing the heterojunction bipolar transistor 20(j,k) to its environment.

It should be noted that the example provided in FIGS. 3-5 is a non-limiting. For example, the base of the heterojunction bipolar transistor may include other materials than SiGe, may not include SiGe, the spatial relationships between the elements of the pixel may differ from those illustrated in FIGS. 3-5, the shape and/or size of the elements of the pixel may differ from those illustrated in FIGS. 3-5, the supporting element may include conductors, the supporting element may be connected to conductors, the supporting element is formed on an oxide layer, the supporting element may include an oxide layer, the supporting element, may include a silicon germanium layer, the pixel may include one or more insulator layers, and the like.

Figure 6:
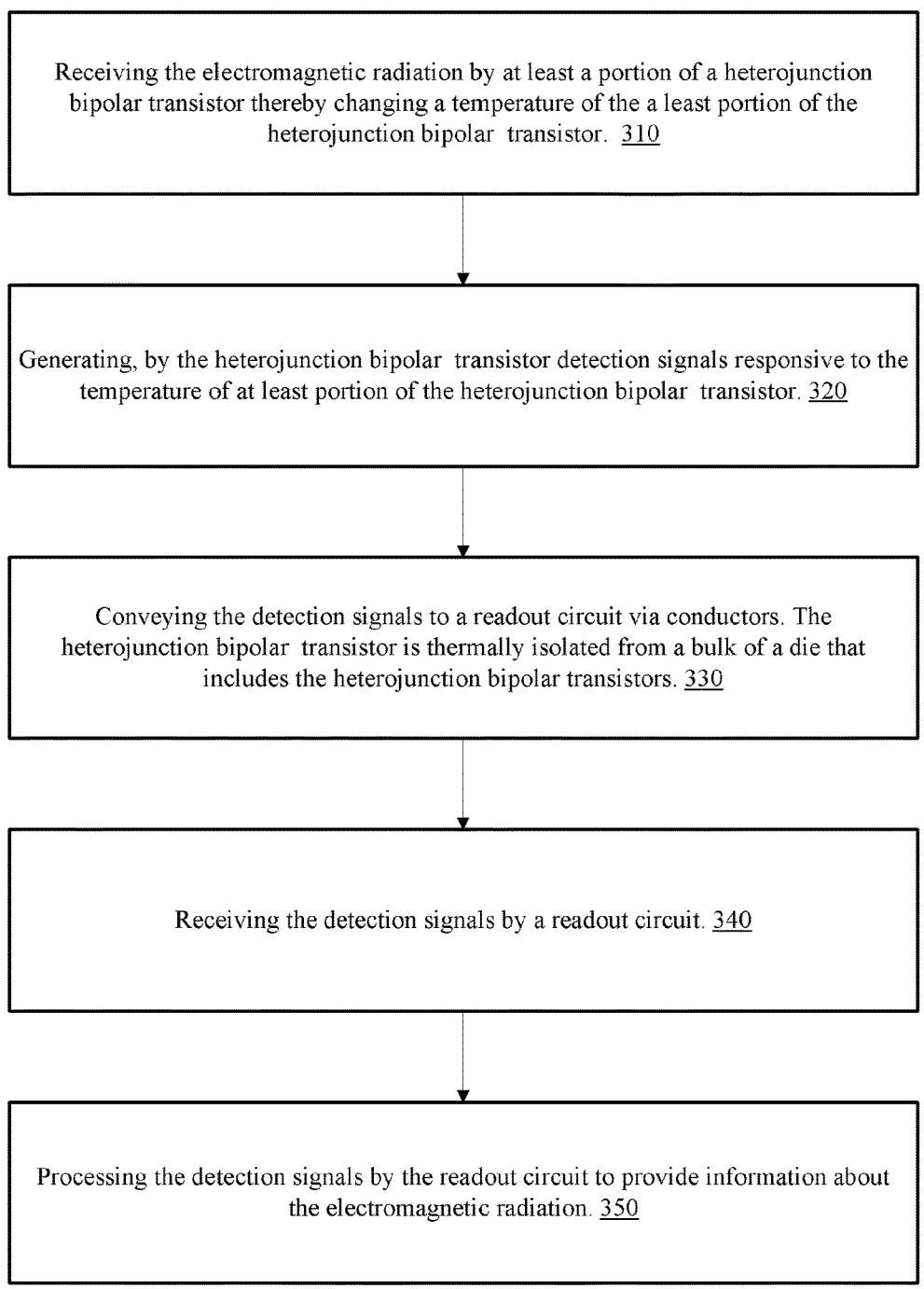
FIG. 6 illustrates a method according to an embodiment of the invention.

FIG. 6 illustrates a method 300 according to an embodiment of the invention.

Method 300 starts by stage 310 of receiving the electromagnetic radiation by at least a portion of a heterojunction bipolar transistor thereby changing a temperature of the at least portion of the heterojunction bipolar transistor. The heterojunction bipolar transistor can be any of the heterojunction bipolar transistors mentioned above.

Stage 310 may be followed by stage 320 of generating, by the heterojunction bipolar transistor, detection signals responsive to the temperature of at least portion of the heterojunction bipolar transistor.

Stage 320 may be followed by stage 330 of conveying the detection signals to a readout circuit via conductors that may be included in (or supported by) a holding element. The heterojunction bipolar transistor is thermally isolated from a bulk of a die that also include the heterojunction bipolar transistor. Alternatively, The conductors may be provided to the heterojunction bipolar transistor without any support from the holding element.

Stage 330 may be followed by stage 340 receiving the detection signals by a readout circuit.

Stage 340 may be followed by stage 350 of processing the detection signals by the readout circuit to provide information about the electromagnetic radiation.

Figure 7:
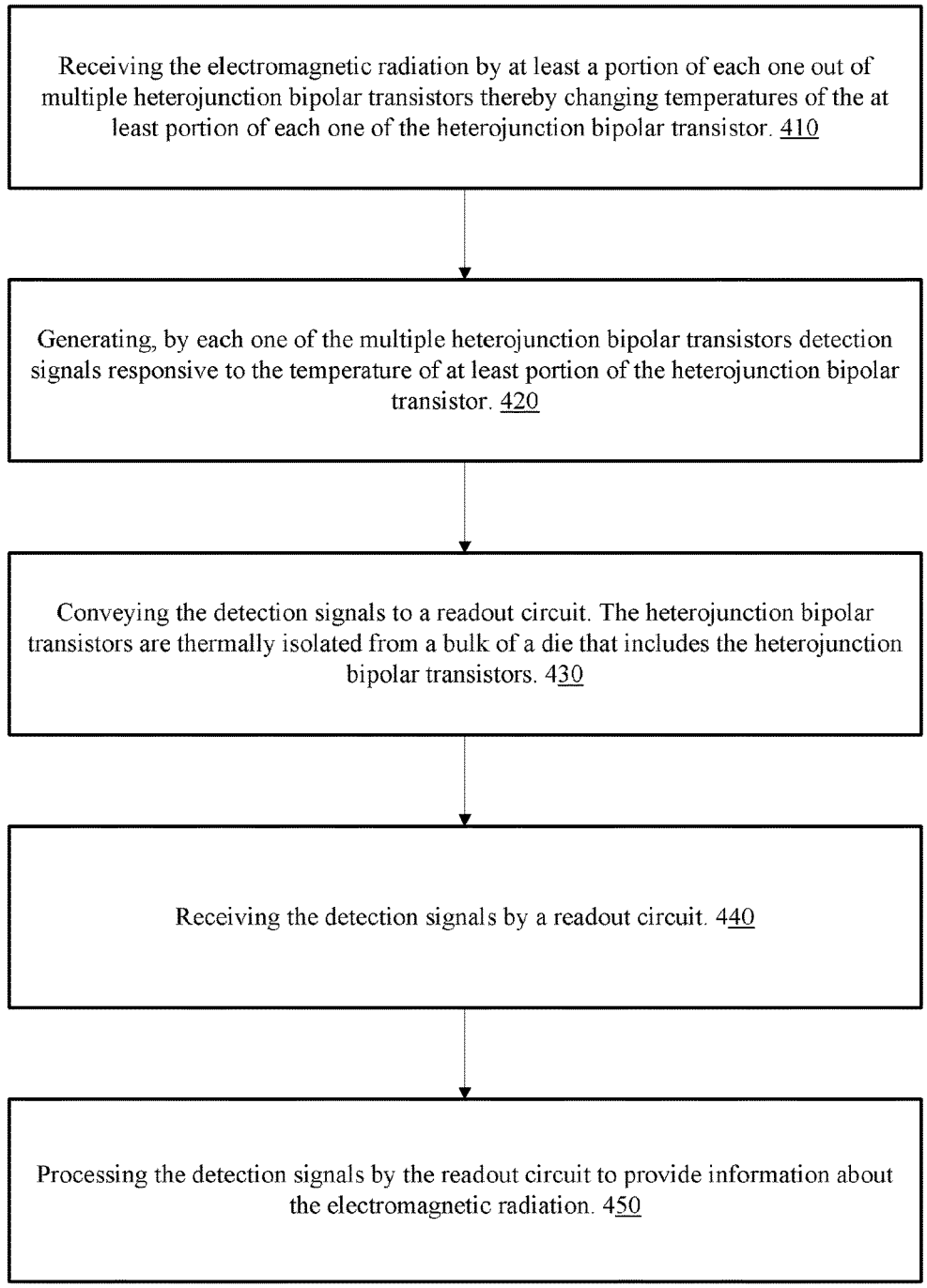
FIG. 7 illustrates a method according to an embodiment of the invention.

FIG. 7 illustrates method 400 according to an embodiment of the invention.

Method 400 includes a sequence of stages 410, 420, 430 and 440.

Stage 410 may include receiving the electromagnetic radiation by at least a portion of each one out of multiple heterojunction bipolar transistors thereby changing temperatures of the at least portion of each one of the heterojunction bipolar transistor.

Stage 440 may include generating, by each one of the multiple heterojunction bipolar transistors, detection signals responsive to the temperature of at least portion of the heterojunction bipolar transistor.

Stage 430 may include conveying the detection signals to the readout circuit, wherein each heterojunction bipolar transistor is thermally isolated from a bulk of a die that also includes the heterojunction bipolar transistors. The detection signals may be conveyed via conductors.

Stages 440 and 450 may include receiving and processing the detection signals by the readout circuit.

Method 400 may include selecting which pixels to read, and biasing the pixels.

Methods 300 and 400 may be executed by the sensing device of FIG. 2.

FIG. 8 illustrates method 500 according to an embodiment of the invention.

Method 500 may start by stage 510 of manufacturing a multi-layered object that comprises upper layers, an intermediate layer and a lower layer. The upper layers may include a heterojunction bipolar transistor, a holding element and a supporting element. The lower layer may include a bulk. The intermediate layer is positioned between the upper layers and the lower layer. It is noted that the intermediate layer and the lower layer may be the same layer—for example they may form a bulk.

Referring to FIGS. 4-5 the upper layers may include a pixel, a holding element and at least a part of a supporting element. The supporting element may be further included in the intermediate layer and the lower layer. The lower layer may include the base. The intermediate layer is virtually not shown in FIGS. 4-5 as it has been removed during stage 520.

Stage 510 may be followed by stage 520 of etching at least a portion of the intermediate layer thereby introducing a gap below the heterojunction bipolar transistor and causing the heterojunction bipolar transistor to be connected only to the holding element and to be thermally isolated from the bulk.

The heterojunction bipolar transistor is configured to generate detection signals. Responsive to a temperature of at least a portion of the heterojunction bipolar transistor; and wherein the pixel comprises an electrical conductor for conveying the detection signals from the heterojunction bipolar transistor.

The holding element may include the electrical conductor. The holding element may be separated from the electrical conductor. The holding element may be coupled to the electrical conductor.

Figure 10:
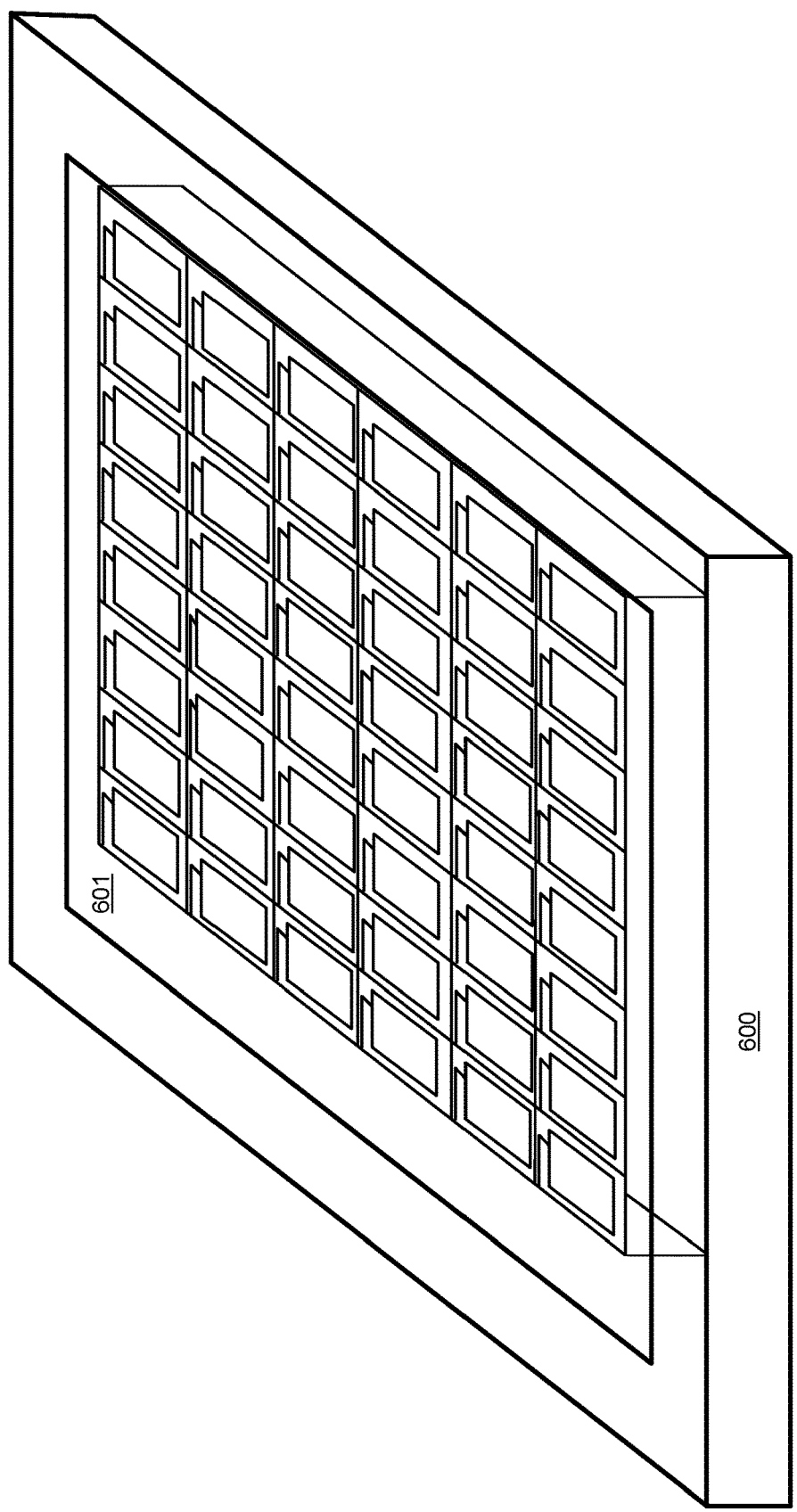
FIG. 10 illustrates a rectangular array of pixels within an enclosure that has a window according to an embodiment of the invention.

The sensing device may include an enclosure that may include a transparent window that allows radiation to pass through the window and impinge onto the pixel. The enclosure may be configured to maintain desired conditions within the enclosure. For example—the enclosure may maintain vacuum inside the enclosure. See, for example— enclosure 600 of FIG. 10, the enclosure 600 has a window 601 through which radiation can propagate. An array of pixels (and even other components of a device) are included in the enclosure.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A sensing device, comprising a readout circuit, a bulk, a holding element and a heterojunction bipolar transistor; wherein heterojunction bipolar transistor is configured to generate detection signals responsive to a temperature of at least a portion of the heterojunction bipolar transistor; wherein the holding element is configured to support the heterojunction bipolar transistor; wherein the heterojunction bipolar transistor is thermally isolated from the bulk; wherein the readout circuit is electrically coupled to the heterojunction bipolar transistor; and wherein the readout circuit is configured to receive the detection signals and to process the detection signals to provide information about electromagnetic radiation that affected the temperature of the at least portion of the heterojunction bipolar transistor; and wherein the heterojunction bipolar transistor comprises a base terminal, an emitter terminal and a collector terminal, and wherein at least two terminals out of the base terminal, the emitter terminal and the collector terminal are positioned at different heights.

2. The sensing device according to claim 1, wherein the heterojunction bipolar transistor comprises a base and wherein the base comprises Silicon Germanium.

3. The sensing device according to claim 1, wherein the heterojunction bipolar transistor comprises a base and wherein the base comprises Silicon Germanium.

4. The sensing device according to claim 1 wherein the heterojunction bipolar transistor comprises a buried collector region, and a buried oxide region; and wherein at least a majority of the base, the base terminal, the emitter terminal, the buried collector region and the buried oxide region are exposed to an environment of the heterojunction bipolar transistor.

5. The sensing device according to claim 1 wherein the heterojunction bipolar transistor is suspended.

6. The sensing device according to claim 1, wherein the heterojunction bipolar transistor is configured to convert infrared radiation to heat.

7. The sensing device according to claim 1, wherein a spatial separation between the bulk and the heterojunction bipolar transistor is obtained by utilizing a Micro Electro Mechanical System (MEMS) micro-machined process.

8. The sensing device according to claim 1, wherein a spatial separation between the bulk and the heterojunction bipolar transistor is obtained by utilizing a Nano Electro Mechanical System (NEMS) nano-machined process.

9. The sensing device according to claim 1, wherein the bulk is formed on an oxide layer.

10. The sensing device according to claim 1, wherein the bulk is formed on an oxide layer and the readout circuit is a Complementary Metal Oxide Semiconductor (CMOS) readout circuit.

11. The sensing device according to claim 1, wherein the bulk comprises an oxide layer.

12. The sensing device according to claim 1, wherein the bulk comprises a silicon germanium layer.

13. The sensing device according to claim 1 comprising one or more insulator layers.

14. The sensing device according to claim 1 wherein the heterojunction bipolar transistors is manufactured using a bipolar complementary metal oxide semiconductor (BiCMOS) technology.

15. The sensing device according to claim 1 comprising multiple pixels.

16. A method for sensing electromagnetic radiation, the method comprises:
receiving the electromagnetic radiation by at least a portion of a heterojunction bipolar transistor thereby changing a temperature of the at least portion of the heterojunction bipolar transistor;
generating, by the heterojunction bipolar transistor, detection signals responsive to the temperature of at least portion of the heterojunction bipolar transistor;
conveying the detection signals to a readout circuit; wherein the heterojunction bipolar transistor is thermally isolated from a bulk;
receiving the detection signals by the readout circuit; and
processing the detection signals, by the readout circuit, to provide information about the electromagnetic radiation;
wherein the heterojunction bipolar transistor comprises a base terminal, an emitter terminal and a collector terminal, and wherein at least two terminals out of the base terminal, the emitter terminal and the collector terminal are positioned at different heights.

17. The method according to claim 16, wherein the heterojunction bipolar transistor comprises a base and wherein the base comprises Silicon Germanium.

18. The method according to claim 16 comprising receiving the electromagnetic radiation by at least a portion of each one out of multiple heterojunction bipolar transistors thereby changing temperatures of the at least portion of each one of the heterojunction bipolar transistor; generating, by each one of the multiple heterojunction bipolar transistors detection signals responsive to the temperature of at least portion of the heterojunction bipolar transistor; conveying the detection signals to the readout circuit; wherein the heterojunction bipolar transistor is thermally isolated from the support element; receiving and processing the detection signals by the readout circuit.

19. The method according to claim 16 comprising receiving the electromagnetic radiation by at least a portion of each one out of multiple heterojunction bipolar transistors thereby changing temperatures of the at least portion of each one of the heterojunction bipolar transistor; generating, by each one of the multiple heterojunction bipolar transistors detection signals responsive to the temperature of at least portion of the heterojunction bipolar transistor; conveying the detection signals to the readout circuit; wherein the heterojunction bipolar transistor is thermally isolated from the support element; receiving and processing the detection signals by the readout circuit.

20. The method according to claim 16, wherein the heterojunction bipolar transistor comprises a base and wherein the base comprises Silicon Germanium.

21. The method according to claim 16 wherein the heterojunction bipolar transistor comprises a buried collector region and a buried oxide region; and wherein at least a majority of the base, the base terminal, the emitter terminal, the buried collector region and the buried oxide region are exposed to an environment of the heterojunction bipolar transistor.

22. The method according to claim 16 wherein the heterojunction bipolar transistor is suspended.

23. The method according to claim 16, wherein the heterojunction bipolar transistor is configured to convert infrared radiation to heat.

24. The method according to claim 16, wherein a spatial separation between the bulk and the heterojunction bipolar transistor is obtained by utilizing a Micro Electro Mechanical System (MEMS) micro-machined process.

25. The method according to claim 16, wherein a spatial separation between the bulk and the heterojunction bipolar transistor is obtained by utilizing a Nano Electro Mechanical System (NEMS) nano-machined process.

26. The method according to claim 16, wherein the bulk is formed on an oxide layer.

27. The method according to claim 16, wherein the bulk is formed on an oxide layer and the readout circuit is a Complementary Metal Oxide Semiconductor (CMOS) readout circuit.

28. The method according to claim 16, wherein the bulk comprises an oxide layer.

29. The method according to claim 16, wherein the bulk comprises a silicon germanium layer.

30. The method according to claim 16 wherein the heterojunction bipolar transistor belongs to a pixel that comprises one or more insulator layers.

31. The method according to claim 16 wherein the heterojunction bipolar transistors is manufactured using a bipolar complementary metal oxide semiconductor (BiCMOS) technology.

32. A method for manufacturing a pixel, the method comprises:
   manufacturing a multi-layered object that comprises upper layers, an intermediate layer and a lower layer;
   wherein the upper layers comprise a heterojunction bipolar transistor, a holding element and a bulk;
   wherein the lower layer comprises a base; wherein the intermediate layer is positioned between the upper layers and the lower layer;
wherein the heterojunction bipolar transistor comprises a base terminal, an emitter terminal and a collector terminal, and wherein at least two terminals out of the base terminal, the emitter terminal and the collector terminal are positioned at different heights; and
   etching at least a portion of the intermediate layer thereby introducing a gap below the heterojunction bipolar transistor and causing the heterojunction bipolar transistor to be connected only to the holding element and to be thermally isolated from the base;
   wherein the heterojunction bipolar transistor is configured to generate detection signals responsive to a temperature of at least a portion of the heterojunction bipolar transistor; and wherein the pixel comprises an electrical conductor for conveying the detection signals from the heterojunction bipolar transistor.

33. The method according to claim 32 wherein the holding element comprises the electrical conductor.

34. The method according to claim 32 wherein the holding element is separated from the electrical conductor.

35. The method according to claim 32 wherein the holding element is coupled to the electrical conductor.

36. The method according to claim 32 wherein the manufacturing a multi-layered object comprises applying a bipolar complementary metal oxide semiconductor technology.

* * * * *